US008786990B2

(12) United States Patent
Prabhu et al.

(10) Patent No.: US 8,786,990 B2
(45) Date of Patent: Jul. 22, 2014

(54) DRIVER-BASED DISTRIBUTED MULTI-PATH ESD SCHEME

(75) Inventors: Manjunatha Prabhu, Singapore (SG); Shan Ryan, Singapore (SG); Mahadeva Iyer Natarajan, Clifton Park, NY (US)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 252 days.

(21) Appl. No.: 13/439,455

(22) Filed: Apr. 4, 2012

(65) Prior Publication Data

US 2013/0265677 A1    Oct. 10, 2013

(51) Int. Cl.
*H02H 9/04*    (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| | | | | |
|---|---|---|---|---|
| 6,445,245 | B1 * | 9/2002 | Schultz et al. | 327/541 |
| 7,706,115 | B2 * | 4/2010 | Hsiung et al. | 361/91.3 |
| 2006/0028776 | A1 * | 2/2006 | Stockinger et al. | 361/56 |
| 2006/0181823 | A1 * | 8/2006 | Miller et al. | 361/56 |

OTHER PUBLICATIONS

Stockinger, M., et al., Boosted and Distributed Rail Clamp Networks for ESD Protection in Advanced CMOS Technologies, EOS/ESD Symposium, 2003, pp. 1-10.

\* cited by examiner

*Primary Examiner* — Jared Fureman
*Assistant Examiner* — Kevin J Comber
(74) *Attorney, Agent, or Firm* — Ditthavong & Steiner, P.C.

(57) ABSTRACT

A driver-based distributed multi-path ESD scheme is disclosed. Embodiments include providing a plurality of I/O cells, wherein each of the I/O cells includes a first driver having a first source, a first drain, and a first gate; and providing a first signal to turn on the first driver in each of the I/O cells during an ESD event to form a plurality of parallel ESD paths that include turned-on first drivers.

15 Claims, 8 Drawing Sheets

US 8,786,990 B2

DRIVER-BASED DISTRIBUTED MULTI-PATH ESD SCHEME

TECHNICAL FIELD

The present disclosure relates to distributed multi-path electrostatic discharge (ESD) schemes. The present disclosure is particularly applicable to driver circuits in 40 nanometer (nm) technology nodes and beyond.

BACKGROUND

Traditionally, local ESD clamping devices are present in driver circuits to provide ESD discharge paths, for instance, from input/output (I/O) (or data) pads to a supply ground, from a power supply to a supply ground, etc. Individual clamping devices, however, typically require wide metal buses since these ESD clamping devices may need to discharge a large amount of ESD current (e.g., as high as 4 amps (A)), and wider metal buses reduce the voltage drop in power rails. Thus, the traditional approach generally results in a substantial amount of chip area consumed by ESD clamping devices, increased off-state leakage, etc.

FIG. 1 schematically illustrates one alternative to circuits with ESD clamping devices requiring wide metal buses. As shown, the circuit in FIG. 1 includes a number of data I/O cells 101 and power cells 103. Each data I/O cell 101 includes I/O pad 105, ESD clamping device 107, and diodes 109. Each power cell 103 includes trigger circuit 111 and transistor 113. Data I/O cells 101 are connected to each other and power cells 103 via power rail 115, trigger rail 117, and ground rail 119 with resistance 121 along the rails 115, 117, and 119. When an ESD event occurs, for instance, at one of the I/O pads 105, the trigger circuit 111 generates a trigger signal to all of the data I/O cells 101 to keep ESD clamping devices 107 on during the ESD event. Because ESD clamping devices 107 are distributed throughout each data I/O cell 101, and ESD current from the ESD event may travel to ground rail 119 through any of these ESD clamping devices 107, the amount of ESD current that each ESD clamping device 107 must carry is reduced, decreasing the size requirement with respect to the width of the metal buses. Nonetheless, the circuit in FIG. 1 requires closely-spaced ESD clamping devices 107 (e.g., the circuit therefore utilizes an ESD clamping device 107 in every data I/O cell 101), and, thus, still requires large areas for ESD clamping devices.

A need therefore exists for an effective ESD solution without sacrificing a substantial amount of chip area (e.g., for ESD clamping devices), and enabling methodology.

SUMMARY

An aspect of the present disclosure is a circuit using driver-based distributed multi-path ESD schemes.

Another aspect of the present disclosure is a method for implementing driver-based distributed multi-path ESD schemes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a circuit including: an ESD trigger circuit; and a plurality of I/O cells, each of the I/O cells including a first driver having a first source, a first drain, and a first gate, wherein the ESD trigger circuit provides a first signal to turn on the first driver in each of the I/O cells during an ESD event to form a plurality of parallel ESD paths that include turned-on first drivers.

Aspects include a circuit having each of the I/O cells include a second driver having a second source, a second drain, and a second gate, wherein the ESD trigger circuit provides the first signal using a first ESD trigger terminal of the ESD trigger circuit, the ESD trigger circuit provides a second signal using a second ESD trigger terminal of the ESD trigger circuit to turn on the second driver in each of the I/O cells during the ESD event, and the parallel ESD paths include turned-on second drivers. Other aspects include ESD current being distributed through the first driver of each of the I/O cells during the ESD event. Further aspects include the ESD current being distributed through the second driver of each of the I/O cells.

Additional aspects include a circuit having each of the I/O cells include: a first pass-gate circuit having a first NMOS gate, a first PMOS gate, a first input, and a first output; and a second pass-gate circuit having a second NMOS gate, a second PMOS gate, a second input, and a second output, wherein the first output is coupled to the first gate and the second output is coupled to the second gate. Aspects further include the first and second pass-gates being turned off during the ESD event, and the first and second pass-gates being turned on during normal operations.

Some aspects include a circuit having each of the I/O cells include: a first transistor having a third source, a third drain, and a third gate; and a second transistor having a fourth source, a fourth drain, and a fourth gate. The first signal may, for instance, be received at the third gate, the first PMOS gate, and the second PMOS gate, and the second signal may be received at the fourth gate, the first NMOS gate, and the second NMOS gate. Further aspects include the third drain being coupled to the first gate, and the fourth drain being coupled to the second gate. Other aspects include a circuit having each of the I/O cells include: an I/O pad coupled to the first and second drains; and a compare circuit coupled to the I/O pad. The compare circuit may, for instance, receive the first and second signals, and then compare a pad voltage at the I/O pad with the first and second signals. Another aspect includes the compare circuit providing a third signal to turn off the first driver and a fourth signal to turn off the second driver when the pad voltage is higher than the first and second signals. A further aspect includes the compare circuit being coupled to the first and second gates.

An additional aspect of the present disclosure is a method including: providing a plurality of I/O cells, wherein each of the I/O cells includes a first driver having a first source, a first drain, and a first gate; and providing a first signal to turn on the first driver in each of the I/O cells during an ESD event to form a plurality of parallel ESD paths that include turned-on first drivers.

Another aspect includes having each of the I/O cells include a second driver having a second source, a second drain, and a second gate. Some aspects include: providing the first signal using a first ESD trigger terminal of an ESD trigger circuit; and providing a second signal, using a second ESD trigger terminal of the ESD trigger circuit, to turn on the second driver in each of the I/O cells during the ESD event, wherein the parallel ESD paths include turned-on second drivers. Some aspects include each of the I/O cells including a first pass-gate circuit having a first NMOS gate, a first PMOS gate, a first input, and a first output; and a second pass-gate circuit having a second NMOS gate, a second PMOS gate, a second input, and a second output, and the method including: coupling the first output to the first gate and the second output to the second gate; turning off the first and second pass-gates during the ESD event; and turning on the first and second pass-gates during normal operations.

Certain aspects include having each of the I/O cells include a first transistor having a third source, a third drain, and a third gate; and a second transistor having a fourth source, a fourth drain, and a fourth gate, the method including: receiving the first signal at the third gate, the first PMOS gate, and the second PMOS gate; and receiving the second signal at the fourth gate, the first NMOS gate, and the second NMOS gate. Other aspects include: coupling the third drain to the first gate, and the fourth drain to the second gate.

Various aspects include having each of the I/O cells include: an I/O pad coupled to the first and second drains; and a compare circuit coupled to the I/O pad, the method including: receiving, at the compare circuit, the first and second signals; and comparing a pad voltage at the I/O pad with the first and second signals. Further aspects include providing, via the compare circuit, a third signal to turn off the first driver and a fourth signal to turn off the second driver when the pad voltage is higher than the first and second signals. Some aspects include coupling the compare circuit to the first and second gates.

Another aspect of the present disclosure is a ring I/O circuit including: an ESD trigger circuit having a first ESD trigger terminal and a second ESD trigger terminal; and a plurality of I/O cells, each of the I/O cells including: a first driver having a first source, a first drain, and a first gate; a second driver having a second source, a second drain, and a second gate, wherein first and second signals are respectively provided using the first and second ESD trigger terminals to turn on the first and second drivers in each of the I/O cells during an ESD event to form a plurality of parallel ESD paths that include turned-on first and second drivers.

Various aspects include a ring I/O circuit having each of the I/O cells include: a first pass-gate circuit having a first NMOS gate, a first PMOS gate, a first input, and a first output; a second pass-gate circuit having a second NMOS gate, a second PMOS gate, a second input, and a second output; a first transistor having a third source, a third drain, and a third gate; and a second transistor having a fourth source, a fourth drain, and a fourth gate, wherein the first output is coupled to the first gate, the second output is coupled to the second gate, the third drain is coupled to the first gate, and the fourth drain is coupled to the second gate, wherein the first signal is received at the third gate, the first PMOS gate, and the second PMOS gate, and the second signal is received at the fourth gate, the first NMOS gate, and the second NMOS gate, and wherein the first and second pass-gates are turned off during the ESD event, and the first and second pass-gates are turned on during normal operations.

Other aspects include a ring I/O circuit having each of the I/O cells include: an I/O pad coupled to the first and second drains; and a compare circuit coupled to the I/O pad, the first gate, and the second gate, wherein the compare circuit receives the first and second signals, and compares a pad voltage at the I/O pad with the first and second signals, and wherein the compare circuit provides a third signal to turn off the first driver and a fourth signal to turn off the second driver when the pad voltage is higher than the first and second signals.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems of reduced available chip area due to the large size and number of ESD clamping devices, increased off-state leakage, etc. The present disclosure addresses and solves such problems, for instance, by, inter alia, providing a first signal to turn on a first driver in each of a plurality of I/O cells during an ESD event to form a plurality of parallel ESD paths that include turned-on first drivers.

Figure 1:
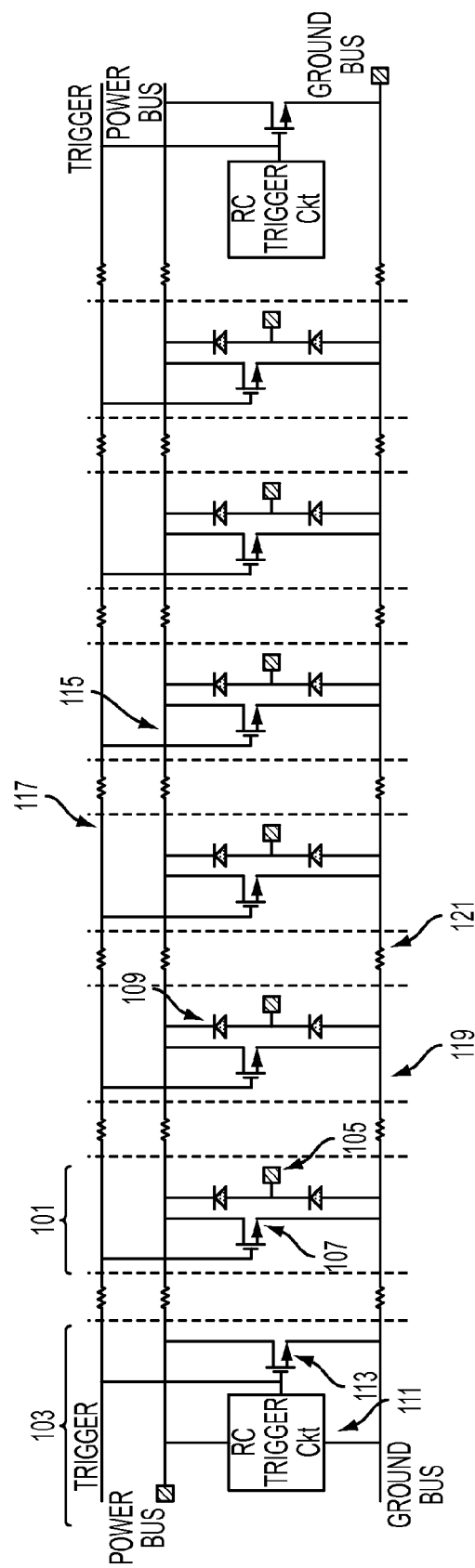
FIG. 1 schematically illustrates one alternative to circuits with ESD clamping devices requiring wide metal buses.
Figure 2A:
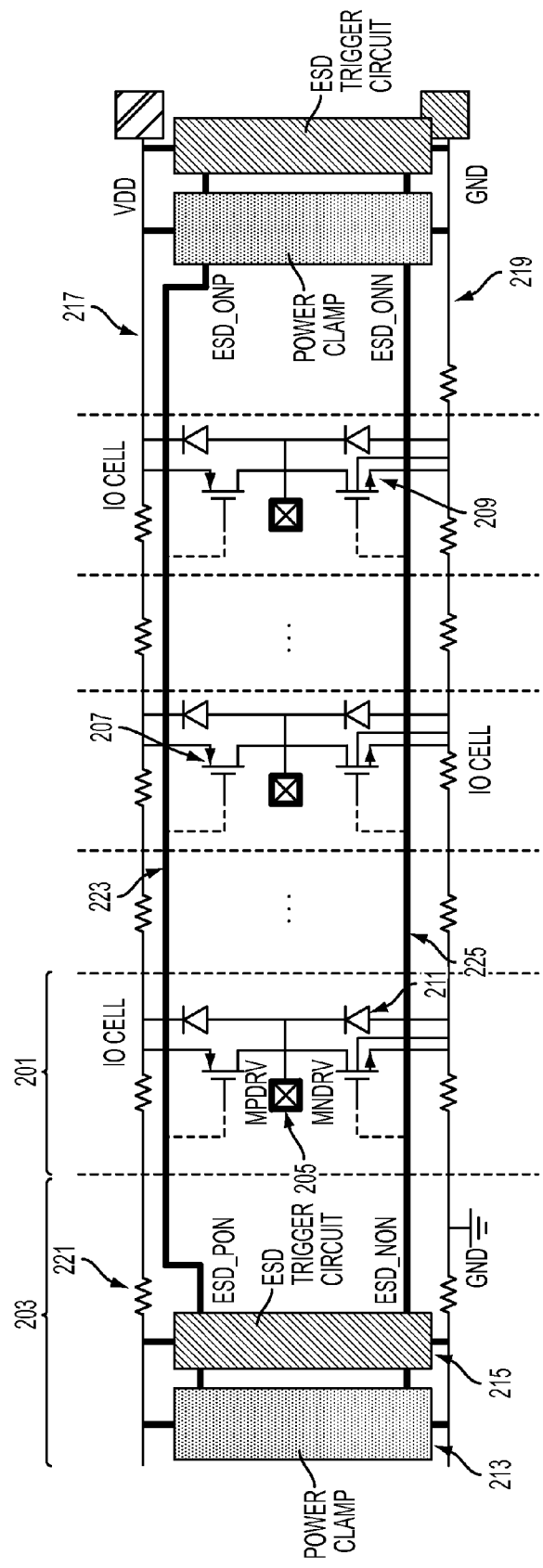
FIGS. 2A-2C schematically illustrate a circuit using a driver-based distributed multi-path ESD scheme, in accordance with an exemplary embodiment of the present disclosure.
Figure 2B:
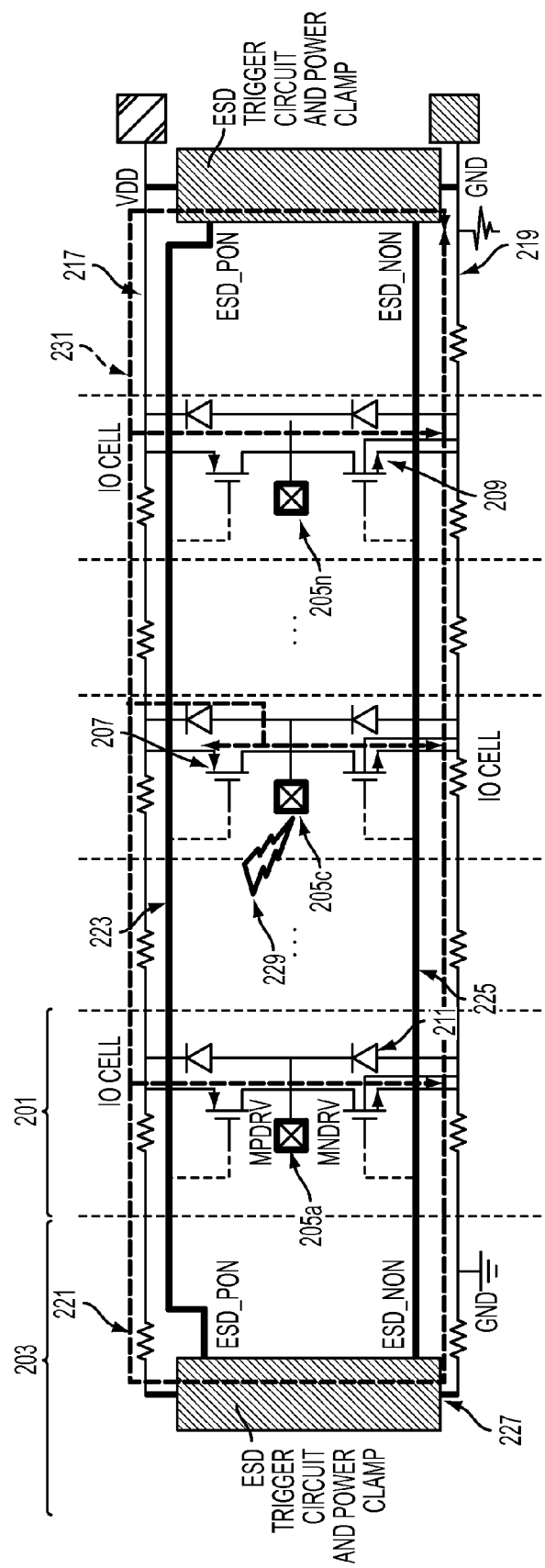
Figure 2C:
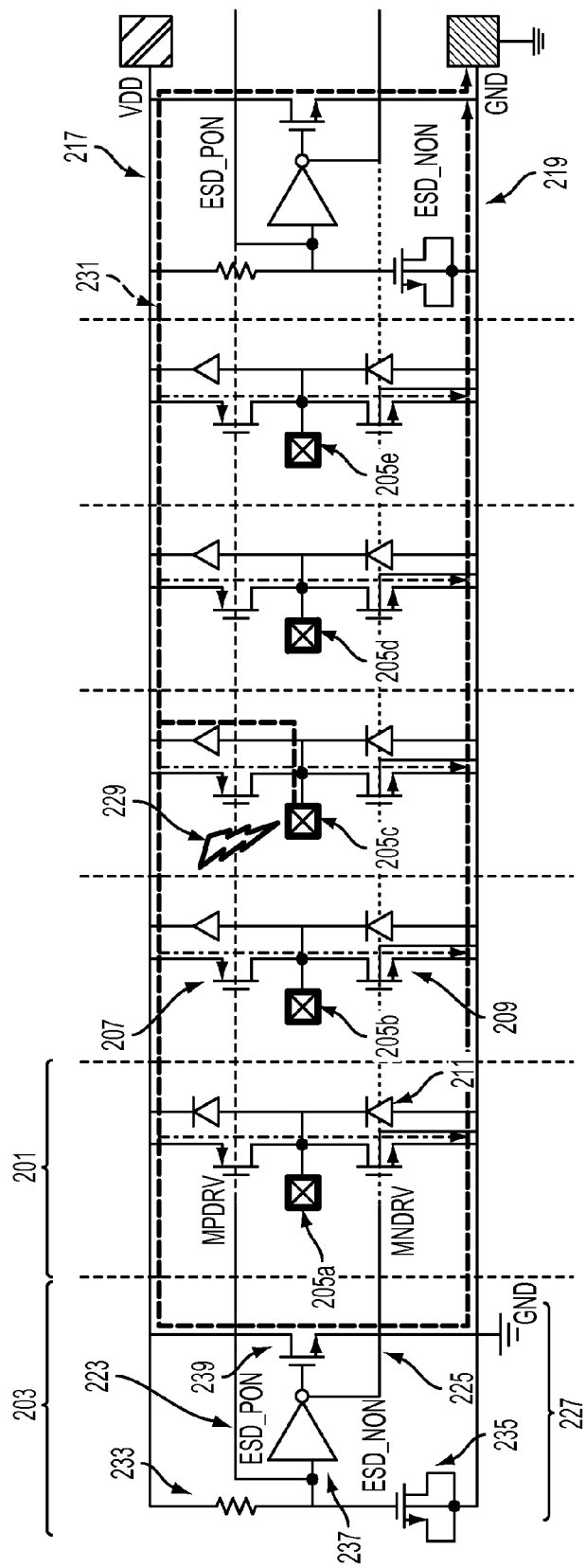

FIGS. 2A-2C schematically illustrate a circuit using a driver-based distributed multi-path ESD scheme, in accordance with an exemplary embodiment of the present disclosure. For example, the circuit shown in FIG. 2A includes a plurality of I/O cells 201 (e.g., data I/O cells) and power cells 203. As illustrated, I/O cell 201 may include I/O pad 205, p-type driver 207 (e.g., PMOS driver transistor), n-type driver 209 (e.g., NMOS driver transistor), and diodes 211. Power cell 203 may include ESD clamping device 213 and ESD trigger circuit 215. I/O cells 201 and power cells 203 may, for instance, be connected through power rail 217 and ground rail 219 with resistances 221 along power and ground rails 217 and 219. In addition, trigger lines 223 and 225 (e.g., providing signals ESD_PON and ESD_NON) may connect I/O cells 201 and power cells 203 (e.g., trigger lines 223 and 225 may couple trigger terminals of ESD trigger circuits 215 to circuitry in the I/O cells 201 to turn on/off drivers 207 and 209 depending on the circumstances). It is noted that although ESD trigger circuits 215 are depicted within power cells 203, ESD trigger circuits 215 may alternatively, or additionally, be present in other types of cells (e.g., filler cells).

Driver transistors (e.g., drivers 207 and 209) are an integral part of an I/O cell, and they typically take up a significant part of the I/O cell. As such, the circuit (or circuits) in FIGS. 2A-2C takes advantage of these driver transistors to carry some of the ESD current. As shown in FIG. 2B, ESD trigger and clamping device 227 (e.g., combination of ESD clamping device 213 and ESD trigger circuit 215) may sense ESD event 229 occurring at I/O pad 205c. Consequently, ESD trigger and clamping device 227 may respectively provide a first signal (e.g., ESD_PON) and a second signal (e.g., ESD_NON) through trigger lines 223 and 225 to activate drivers 207 and 209 in the I/O cells 201. As such, ESD current 231 from ESD event 229 may travel to ground rail 219 through each of the turned-on drivers 207 and 209. Because the turned-on drivers 207 and 209 form multiple parallel paths for ESD current 231 to travel to ground, ESD current 231 may be distributed among the multiple parallel paths, which drastically reduces the ESD impact on any one driver transistor. Thus, even though a single driver transistor (e.g., p-type driver 207, n-type driver 209, etc.) may not be as robust against ESD events as a typical ESD clamping device, the distribution of ESD current 231 through numerous parallel paths made up of drivers 207 and 209 enables the collection of drivers (e.g., the plurality of drivers 207 and 209) to absorb the ESD impact. In addition, the distribution of ESD current 231 through the numerous parallel paths made up of drivers 207 and 209 reduces bus resistance (and, thus, voltage drops in bus resistance) as well as the amount of current that has to flow through the overall circuit's ESD clamping devices. Accordingly, the need for numerous, closely-spaced ESD clamping devices may be eliminated.

As shown in FIG. 2C, ESD trigger and clamping device 227 may include resistor 233 and capacitor 235 coupled to a first terminal of inverter 237, and transistor 239 coupled to a second terminal of inverter 237. As indicated, the first terminal may provide the first signal (e.g., ESD_PON over trigger line 223) and the second terminal may provide the second signal (e.g., ESD_NON over trigger line 225), for instance, to switch on/off drivers 207 and 209 depending on the operation mode (e.g., ESD event, normal operation, etc.).

Figure 3:
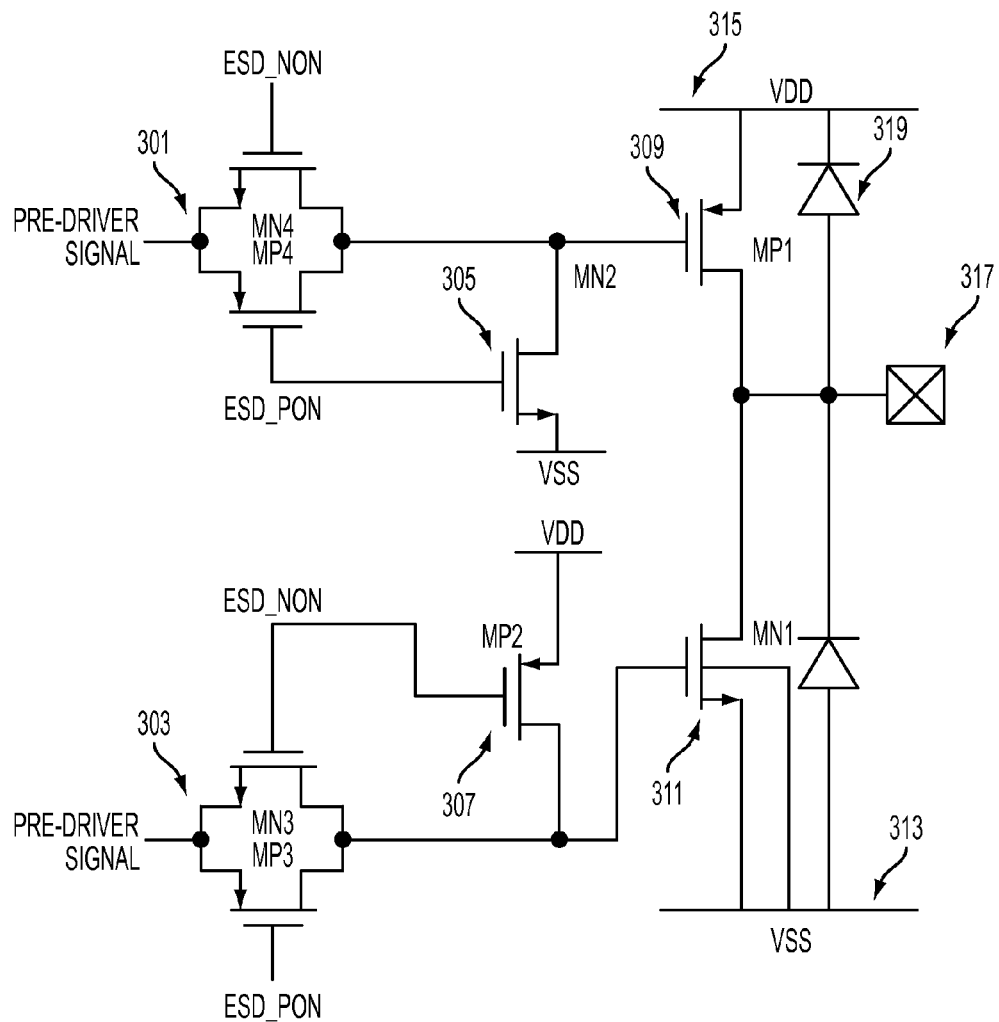
FIG. 3 schematically illustrates circuitry for a driver-based distributed multi-path ESD scheme to avoid interference during normal operations, in accordance with an exemplary embodiment of the present disclosure.

FIG. 3 schematically illustrates circuitry for a driver-based distributed multi-path ESD scheme to avoid interference during normal operations, in accordance with an exemplary embodiment of the present disclosure. As depicted, the ESD_PON and ESD_NON signals may be fed to the gates of pass-gates 301 and 303 along with the gates of transistors 305 and 307 (e.g., NMOS and PMOS transistors). Specifically, the ESD_PON signal may be fed to the gate of transistor 305, the PMOS gate of pass-gate 301, and the PMOS gate of pass-gate 303. The ESD_NON signal may be fed to the gate of transistor 307, the NMOS gate of pass-gate 301, and the NMOS gate of pass-gate 303. For illustrative purposes, during an ESD event, the ESD_PON signal may be "high," and the ESD_NON signal may be "low." As such, pass-gates 301 and 303 are turned off, and transistors 305 and 307 are turned on, which results in drivers 309 and 311 being turned on (e.g., during the ESD event, the gate of driver 309 becomes connected to ground rail 313, and the gate of driver 311 becomes connected to power rail 315). Accordingly, ESD current may, for instance, flow from I/O pad 317 to ground rail 313 through one or more paths including: a path through driver 311; a path through diodes 319, power rail 315, and drivers 309 and 311; or a path through other drivers 309 and 311 of other I/O cells.

On the other hand, during normal operations, the ESD_PON signal may be "low," and the ESD_NON signal may be "high." Thus, pass-gates 301 and 303 are turned on, and transistors 305 and 307 are turned off. Consequently, during normal operations, the state of drivers 309 and 311 are based on the pre-driver signals received at the source inputs of pass-gates 301 and 303, and the ESD_PON and ESD_NON signals will not affect such operations.

Figure 4:
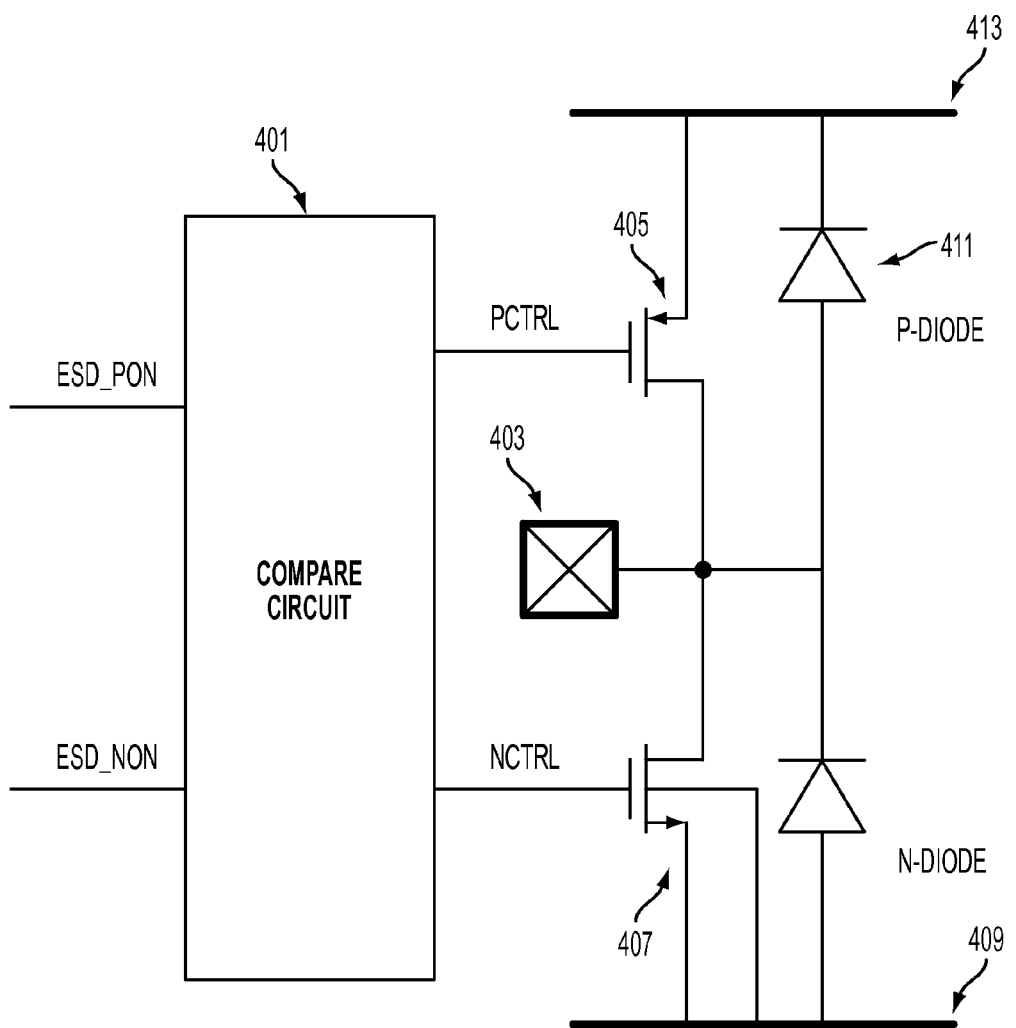
FIG. 4 schematically illustrates a compare circuit for a driver-based distributed multi-path ESD scheme to avoid overstressing a driver, in accordance with an exemplary embodiment of the present disclosure.

FIG. 4 schematically illustrates a compare circuit for a driver-based distributed multi-path ESD scheme to avoid overstressing a driver, in accordance with an exemplary embodiment of the present disclosure. For example, when there is a gate bias, snapback trigger voltage of driver transistors (e.g., NMOS and PMOS driver transistors) may be reduced. If, for instance, the driver devices are fully silicided, then those driver devices may fail as soon as they go into the snapback mode of conduction. To avoid this situation, additional circuitry, such as compare circuit 401, may be provided. As shown, compare circuit 401 may receive, at its two input terminals, first and second signals (e.g., ESD_PON and ESD_NON). In addition, compare circuit 401 may check the voltage at I/O pad 403 to determine whether an ESD event has occurred at the particular I/O pad 403 to which compare circuit 401 is directly connected (or at I/O pad 403 within the same I/O cell as drivers 405 and 407 that are associated with the compare circuit 401).

By way of example, compare circuit 401 may compare the pad voltage with the first and second signals. If, for instance, the pad voltage is higher than the first and second signals (e.g., the pad voltage is higher than the higher of the two signals), the compare circuit may determine that an ESD event has occurred at the particular I/O pad 403 within the same I/O cell as the associated drivers 405 and 407. As such, compare circuit 401 may provide third and fourth signals (e.g., PCTRL="high," and NCTRL="low") to the respective gates of the associated drivers 405 and 407 to turn off those drivers 405 and 407 (e.g., for the duration of the ESD event) to prevent a current path from the particular I/O pad 403 to ground rail 409 through drivers 405 and 407 within the same I/O cell. As a result, compare circuit 401 effectively reduces the potential for failure of drivers 405 and 407 from the ESD event (e.g., even when those drivers 405 and 407 are fully silicided).

It is noted, however, that ESD current from an ESD event occurring at the I/O pad 403 may still travel among numerous parallel paths to ground rail 409 that include, for instance, traveling up diodes 411 across power rail 413 (or other rails, buses, etc.) and through numerous other drivers 405 and 407 of other I/O cells. Thus, the additional circuitry with compare circuit 401 will still reduce bus resistance across the overall circuit along with the amount of current that has to flow through the overall circuit's ESD clamping devices. Consequently, numerous closely-spaced ESD clamping devices are not needed.

Figure 5:
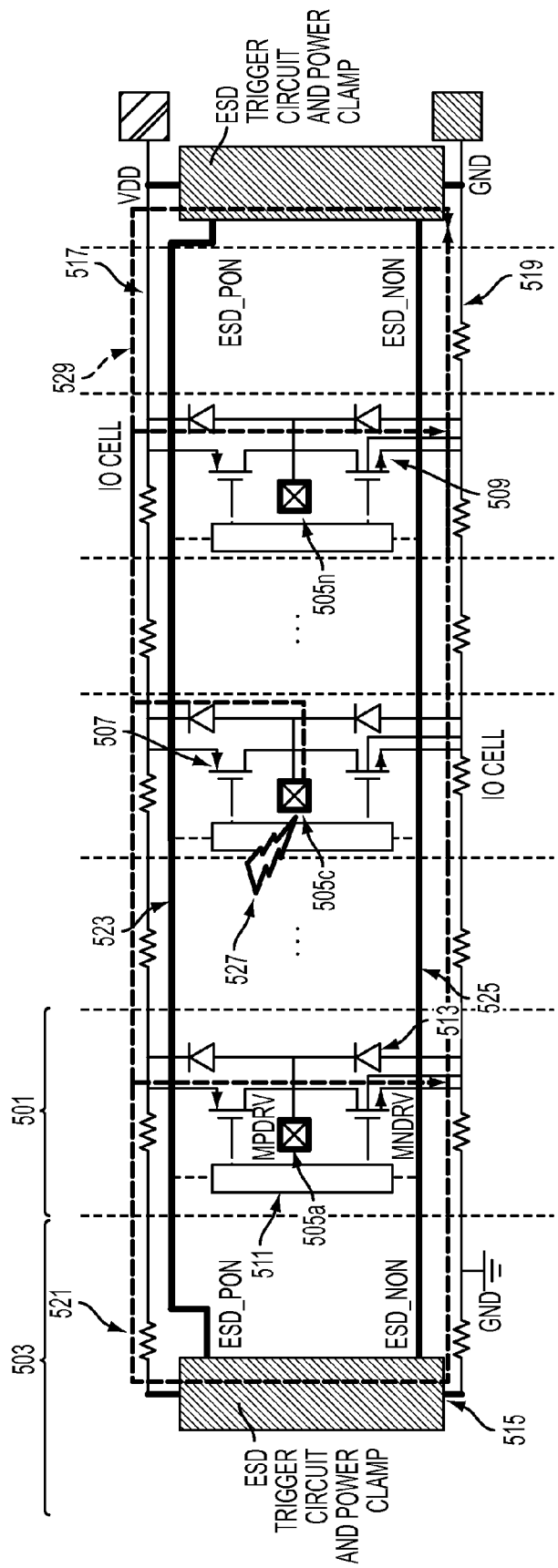
FIG. 5 schematically illustrates a circuit using a driver-based distributed multi-path ESD scheme with compare circuits, in accordance with an exemplary embodiment of the present disclosure.

FIG. 5 schematically illustrates a circuit using a driver-based distributed multi-path ESD scheme with compare circuits, in accordance with an exemplary embodiment of the present disclosure. For example, the circuit shown in FIG. 5 includes a plurality of I/O cells 501 (e.g., data I/O cells) and power cells 503. I/O cell 501 may include I/O pad 505, p-type driver 507 (e.g., PMOS driver transistor), n-type driver 509 (e.g., NMOS driver transistor), compare circuit 511, and diodes 513. Power cell 503 may include ESD trigger and clamping device 515. I/O cells 501 and power cells 503 may, for instance, be connected through power rail 517 and ground rail 519 with resistances 521 along power and ground rails 517 and 519. In addition, trigger lines 523 and 525 (e.g., providing signals ESD_PON and ESD_NON) may connect I/O cells 501 and power cells 503 (e.g., trigger lines 523 and 525 may couple trigger terminals of ESD trigger and clamping device 515 to circuitry in the I/O cells 501 to turn on/off drivers 507 and 509 depending on the circumstances).

As depicted, ESD event 527 may occur at I/O pad 505c, resulting in the flow of ESD current 529 from I/O pad 505 to ground rail 519. However, when the particular compare circuit 511 determines that the voltage at the I/O pad 505c is greater than the ESD_PON and ESD_NON signals, the compare circuit 511 will provide respective signals (e.g., PCTRL="high," and NCTRL="low") to the gates of drivers 507 and 509 that are within the same I/O cell as the I/O pad 505c to keep those drivers 507 and 509 off during ESD event 527. Consequently, although ESD current 529 is distributed throughout many parallel paths that include drivers 507 and 509 of other I/O cells 501, the paths do not include the particular drivers 507 and 509 within the same I/O cell 501 as I/O pad 505c. As indicated, keeping those drivers in an off-state effectively increases the life of those drivers since potential for failure of those drivers from ESD event 527 are reduced (e.g., even when those drivers are fully silicided).

Figure 6:
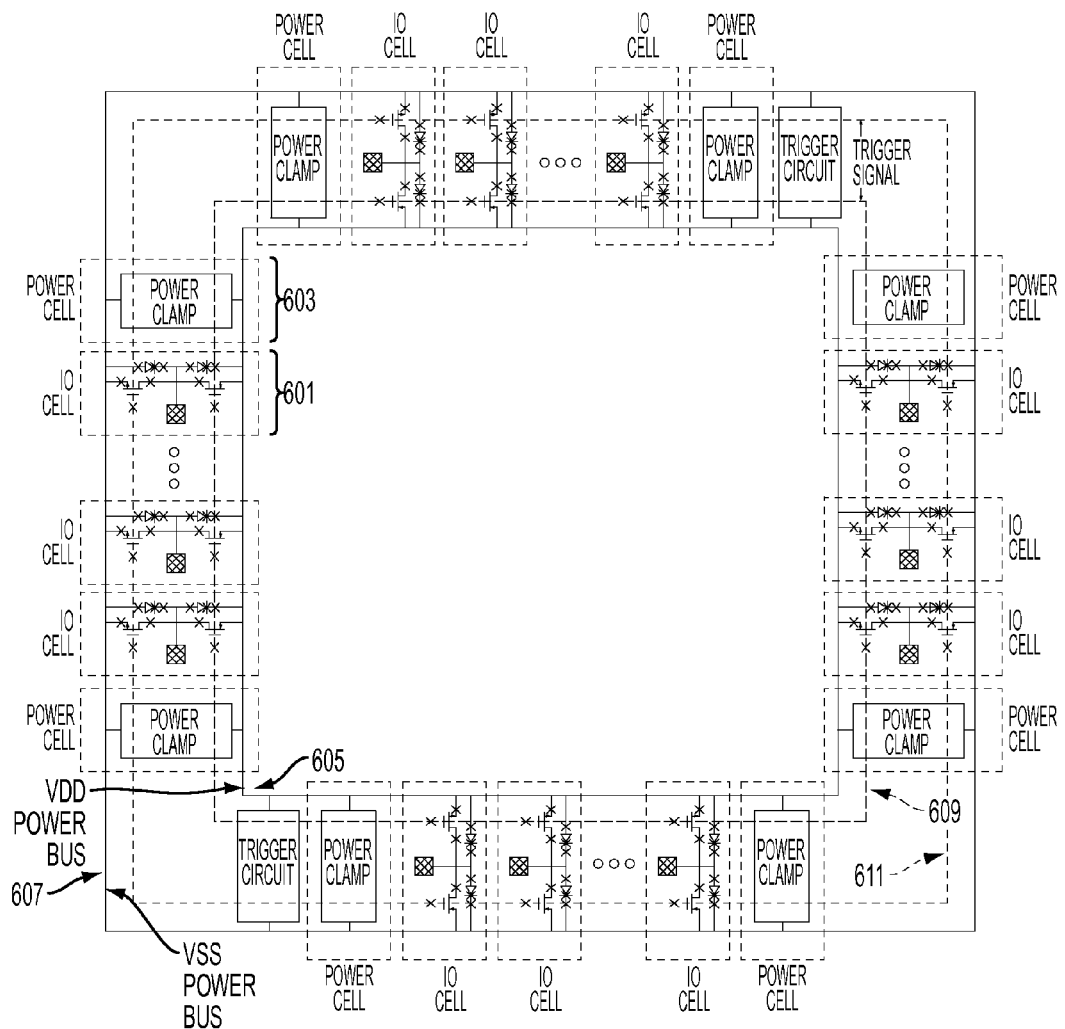
FIG. 6 schematically illustrates a ring I/O circuit using a driver-based distributed multi-path ESD scheme, in accordance with an exemplary embodiment of the present disclosure.

FIG. 6 schematically illustrates a ring I/O circuit using a driver-based distributed multi-path ESD scheme, in accordance with an exemplary embodiment of the present disclosure. As shown, the circuit in FIG. 6 includes a plurality of I/O cells 601 and power cells 603. I/O cell 601 may, for instance, include the components of I/O cell 201 and/or the components of I/O cell 501, and power cell 603 may include the components of power cell 203 and/or the components of power cell 503. In addition, I/O cells 601 and power cells 603 may be connected via power rail 605, ground rail 607, trigger lines 609 and 611, etc. In this way, the driver-based distributed multi-path ESD scheme may effectively be utilized throughout the ring I/O circuit.

The embodiments of the present disclosure can achieve several technical effects, including effective and compact ESD protection. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, including, for instance, devices that benefits from reliable ESD protection schemes that utilize less chip area.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A circuit comprising:
   an ESD trigger circuit; and
   a plurality of I/O cells, each of the I/O cells including a first driver having a first source, a first drain, and a first gate, and a second driver having a second source, a second drain, and a second gate, wherein the ESD trigger circuit provides a first signal using a first ESD trigger terminal of the ESD trigger circuit to turn on the first driver in each of the I/O cells during an ESD event and a second signal using a second ESD trigger terminal of the ESD trigger circuit to turn on the second driver in each of the I/O cells during the ESD event to form a plurality of parallel ESD paths that include turned-on first drivers and turned-on second drivers;
   wherein each of the I/O cells further includes:
   an I/O pad coupled to the first and second drains; and
   a compare circuit coupled to the I/O pad, wherein the compare circuit receives the first and second signals, and compares a pad voltage at the I/O pad with the first and second signals.

2. The circuit according to claim 1, wherein each of the I/O cells further includes:
   a first pass-gate circuit having a first NMOS gate, a first PMOS gate, a first input, and a first output; and
   a second pass-gate circuit having a second NMOS gate, a second PMOS gate, a second input, and a second output, wherein the first output is coupled to the first gate and the second output is coupled to the second gate, the first and second pass-gates are turned off during the ESD event, and the first and second pass-gates are turned on during normal operations.

3. The circuit according to claim 2, wherein each of the I/O cells further includes:
   a first transistor having a third source, a third drain, and a third gate; and
   a second transistor having a fourth source, a fourth drain, and a fourth gate, wherein the first signal is received at the third gate, the first PMOS gate, and the second PMOS gate, and the second signal is received at the fourth gate, the first NMOS gate, and the second NMOS gate.

4. The circuit according to claim 3, wherein the third drain is coupled to the first gate, and the fourth drain is coupled to the second gate.

5. The circuit according to claim 1, wherein the compare circuit provides a third signal to turn off the first driver and a fourth signal to turn off the second driver when the pad voltage is higher than the first and second signals.

6. The circuit according to claim 1, wherein the compare circuit is coupled to the first and second gates.

7. The circuit according to claim 1, wherein ESD current is distributed through the first driver of each of the I/O cells during the ESD event.

8. A method comprising:
   providing a plurality of I/O cells, wherein each of the I/O cells includes a first driver having a first source, a first drain, and a first gate and a second driver having a second source, a second drain and a second gate; and
   providing a first signal using a first ESD trigger terminal of an ESD trigger circuit to turn on the first driver in each of the I/O cells during an ESD event and a second signal using a second ESD trigger terminal of the ESD trigger circuit to turn on the second driver in each of the I/O cells during the ESD event to form a plurality of parallel ESD paths that include turned-on first drivers and turned-on second drivers;

wherein each of the I/O cells further includes:

an I/O pad coupled to the first and second drains; and a compare circuit coupled to the I/O pad, the method further comprising:

receiving, at the compare circuit, the first and second signals; and comparing a pad voltage at the I/O pad with the first and second signals.

9. The method according to claim 8, wherein each of the I/O cells further includes:

a first pass-gate circuit having a first NMOS gate, a first PMOS gate, a first input, and a first output; and a second pass-gate circuit having a second NMOS gate, a second PMOS gate, a second input, and a second output, the method further comprising:

coupling the first output to the first gate and the second output to the second gate;

turning off the first and second pass-gates during the ESD event; and turning on the first and second pass-gates during normal operations.

10. The method according to claim 9, wherein each of the I/O cells further includes:

a first transistor having a third source, a third drain, and a third gate; and a second transistor having a fourth source, a fourth drain, and a fourth gate, the method further comprising:

receiving the first signal at the third gate, the first PMOS gate, and the second PMOS gate; and receiving the second signal at the fourth gate, the first NMOS gate, and the second NMOS gate.

11. The method according to claim 10, further comprising coupling the third drain to the first gate, and the fourth drain to the second gate.

12. The method according to claim 8, further comprising providing, via the compare circuit, a third signal to turn off the first driver and a fourth signal to turn off the second driver when the pad voltage is higher than the first and second signals.

13. The method according to claim 8, further comprising coupling the compare circuit to the first and second gates.

14. A ring I/O circuit comprising:

an ESD trigger circuit having a first ESD trigger terminal and a second ESD trigger terminal; and a plurality of I/O cells, each of the I/O cells including:

a first driver having a first source, a first drain, and a first gate;

a second driver having a second source, a second drain, and a second gate, wherein first and second signals are respectively provided using the first and second ESD trigger terminals to turn on the first and second drivers in each of the I/O cells during an ESD event to form a plurality of parallel ESD paths that include turned-on first and second drivers; wherein each of the I/O cells further includes:

an I/O pad coupled to the first and second drains; and a compare circuit coupled to the I/O pad, the first gate, and the second gate, wherein the compare circuit receives the first and second signals, and compares a pad voltage at the I/O pad with the first and second signals, and wherein the compare circuit provides a third signal to turn off the first driver and a fourth signal to turn off the second driver when the pad voltage is higher than the first and second signals.

15. The ring I/O circuit according to claim 14, wherein each of the I/O cells further includes:

a first pass-gate circuit having a first NMOS gate, a first PMOS gate, a first input, and a first output;

a second pass-gate circuit having a second NMOS gate, a second PMOS gate, a second input, and a second output;

a first transistor having a third source, a third drain, and a third gate; and a second transistor having a fourth source, a fourth drain, and a fourth gate, wherein the first output is coupled to the first gate, the second output is coupled to the second gate, the third drain is coupled to the first gate, and the fourth drain is coupled to the second gate, wherein the first signal is received at the third gate, the first PMOS gate, and the second PMOS gate, and the second signal is received at the fourth gate, the first NMOS gate, and the second NMOS gate, and wherein the first and second pass-gates are turned off during the ESD event, and the first and second pass-gates are turned on during normal operations.

* * * * *